GLASS-TO-METAL SEALS IN ELECTRONIC DEVICES

Filed Dec. 31, 1964

INVENTOR.
WILLIAM S. AUGUST

BY

Fraser & Bogucki

ATTORNEYS

United States Patent Office 3,304,362

Patented Feb. 14, 1967

3,304,362

GLASS-TO-METAL SEALS IN ELECTRONIC DEVICES

William S. August, Altadena, Calif., assignor to Inland Electronic Products Corporation, Pasadena, Calif., a corporation of California Filed Dec. 31, 1964, Ser. No. 422,597
16 Claims. (Cl. 174—50.56)

The present invention generally relates to electronic devices and more particularly relates to improved electronic devices having increased high temperature stability under fluctuating temperature conditions.

Various types of electronic devices employ one or more electrically conductive layers or components which are provided with electrical insulation. Where a plurality of layers are present, the electrically conductive layers are electrically insulated from one another by layers or components which are either semi-conductive in nature or which are true electrical insulators. For example, in certain semi-conductive devices, such as the usual germanium diodes, a semi-conductive p-n junction type germanium wafer is connected, as by brazing, on opposite sides of the junction, to electrically conductive metallic leads. One of the leads may be, for example, in the form of a heat dissipating base electrode of substantial surface area, inasmuch as certain semi-conductive devices during use generate considerable quantities of heat. The heat must be rapidly dissipated in order to assure stability of the electrical properties of the diode.

However, certain difficulties have been encountered with devices of the described types. In this regard, certain base electrode metals which have high thermal conductivity and therefore are highly effective for purposes of heat dissipation from the diode unfortunately have coefficients of thermal expansion considerably different from those of the conventional semi-conductors of the diodes, and from those of the brazing materials, if any, which may be utilized to join the wafer to the base electrode. If such diodes are subjected to rapid and widely varying temperature fluctuations during use, there is a pronounced tendency for the semi-conductive wafer to separate from the base electrode, thereby reducing the desired electrical and thermal contacts therebetween and seriously affecting the durability and desired electrical properties of the diode. Moreover, most metallic base electrodes which can be selected because their coefficients of thermal expansion more or less closely approximate that of the semi-conductor unfortunately have relatively low rates of thermal conductivity so that they are relatively inefficient heat dissipators. If heat is allowed to build up in the device, both the durability and electrical properties again are adversely affected.

Accordingly, it would be desirable to provide an electronic semi-conductive device which is capable of providing improved heat dissipation from a semi-conductive component through the base electrode, and which utilizes a base electrode which has properties such that the device exhibits improved stability and resistance to cracking between the base electrode and semi-conductor under widely fluctuating temperatures.

Various other conventional electronic devices also employ electrically conductive layers or components separated from one another by electrically insulative components such as glass, ceramic and the like. The same problems are encountered as previously described with respect to semi-conductive devices i.e. difficulties in maximizing both the high temperature stability and heat dissipation.

As an example, certain conventional resistors employ vapor deposited or printed electrically conductive circuitry applied to electrically insulative layers such as glass, alumina, beryllia and the like. Such devices also commonly employ heat dissipative means as well as electrically conductive leads and the like connected to the insulative layers. Poor heat dissipation and/or cracking at the interfaces of layers of differing coefficients of thermal expansion are commonly encountered, with consequent serious depreciation of the electrical efficiency and durability of the devices.

As another example, certain types of electronic devices comprise "canned" or hermetically sealed devices such as canned relays wherein metallic containers are provided which define one or more apertures through which electrically conductive leads are fed into the main cavity defined by the container. The leads are electrically insulated from the container by suitable material such as glass or the like disposed in the apertures in the containers and through which the leads pass, so that the containers are hermetically sealed. Hermetic sealing protects the internal components of the device against contamination from the atmosphere, while the container also furnishes mechanical protection for internal components. In certain of the described canned types of devices, it is desirable to employ a canning material which, although electrically conductive and also corrosion resistant, is non-magnetic. Moreover, it may also be desirable to employ lead material and canning material which can be directly fused to the electrically insulative hermetic sealing material and which is also compatible with internal components of the device. In such instances, interposed brazing and bonding agents can be eliminated, so as to reduce cost of the devices and improve durability. Moreover, both the container and the electrical leads should have high thermal conductivity and other properties such that the container and leads are compatible with the glass or other insulative layer employed in the device, and such that cracking therebetween is suppressed or eliminated.

Heretofore, it has been very difficult to provide canning and lead material meeting the indicated requirements and desirable features. One of the most popular materials utilized for leads and canning material in hermetic sealing applications has been an alloy of iron commercially known as Kovar. Kovar has the advantage of being readily wettable with glass, so that there is no problem of providing a hermetic seal therewith. Moreover, Kovar has approximately the same coefficient of thermal expansion as glass within a limited temperature range. However, Kovar is defective as a canning material because it has a relatively low thermal conductivity, because it is ferromagnetic and because it does not maintain its dimensional stability over a wide temperature range. Accordingly, it would be highly desirable if hermetically sealed electronic devices could be provided which would overcome the described deficiencies of Kovar-containing devices.

Accordingly the principal object of the present invention is to provide electronic devices having improved high temperature stability.

A further object of the present invention is to provide electronic devices exhibiting improved durability and stability of electrical characteristics over a wide temperature range.

It is also an object of the present invention to provide electronic devices exhibiting maximum compatibility between electrically conductive and electrically insulative or electrically semi-conductive components of the device for maximum durability and stability as well as high heat dissipation properties.

It is a still further object of the present invention to provide improved hermetically sealed electronic devices wherein components thereof are directly and permanently bonded together and resist cracking therebetween even when subjected to widely fluctuating temperatures.

It is yet another object of the present invention to provide an improved hermetically sealed non-magnetic device having improved corrosion resistance, dimensional stability, thermal conductivity and durability.

The foregoing and other objects have been accomplished, in accordance with the present invention, by providing improved electronic devices which exhibit increased structural and dimensional stability and durability over a wide temperature range, as well as high thermal conductivity. The devices employ one or more electrically conductive components, the coefficients of thermal expansion, the low modulus of elasticity and the high tensile strength of which cooperate to provide improved compatibility with components of the device having reduced electrical conductivity so that cracking between the components is suppressed. The components are readily and permanently bonded to one another to provide and maintain the desired high thermal conductivity.

As a particular example of one embodiment of the present invention, a hermetically sealed "canned" electronic relay comprises a first electrically conductive layer or component in the form of a container defining a plurality of apertures. A second electrically conductive component or layer is provided in the form of a plurality of lead wires passing into the container, one lead wire for each aperture, and an electrically insulative layer or component of glass is used to hermetically seal the lead wires in place in the apertures and to electrically insulate them from the container during assembly of the device.

Both the container and the leads are fabricated of a substrate of an oxidation hardened, high temperature silver base alloy which contains about 0.1 percent, by weight, of magnesium oxide and about 0.4 percent, by weight, of nickel oxide, essentially the remainder (about 99.5 percent, by weight) being silver which may contain a trace concentration of silver oxide. Moreover, a trace amount of rhodium is present as a stabilizer and diffusion depressant. This alloy has a selected coefficient of thermal expansion, a sufficiently low modulus of elasticity and sufficiently high tensile strength to be compatible with the glass, which has a $10\times10^{-6}$ cm.$^2$/° C. coefficient of thermal expansion. The alloy has an electrical conductivity of 92%, a thermal conductivity of 92% and a high melting point of 1650° F., and exhibits dimensional stability within a wide range of from about −60° F. to about 1400° F. The alloy is strong, since it has a tensile strength of about 80,600 p.s.i., a low modulus of elasticity of the order of about $13.5–14\times10^6$ and a high yield of strength of the order of about 78,000 p.s.i. Its thermal conductivity yields a temperature rise of only about 1/15 that of Kovar when used in the same type of an arrangement and over the same temperature range.

The substrate is about 0.07000 inch thick and is integrally bonded to and wholly enclosed within a gold diffusion layer about 0.0001 inch thick comprising pure gold diffused into the outer boundary of the alloy. The gold diffusion layer, in turn, is integrally bonded to and wholly enclosed within a top layer of pure gold which is about 0.00001 inch thick. The gold diffusion and top gold layers render the device non-corrosive in a variety of atmospheres so that the container and leads are extremely durable even under adverse conditions of temperature, atmosphere and the like. The leads pass into the container and form stationary relay contacts, movable relay contacts also being formed from the same material. The device also includes conventional means, such as an electromagnet, for actuating the movable contacts. The relay device is durable, structurally stable, corrosion resistant and capable of operating efficiently over a wide temperature range.

Further objects and advantages of the present invention will be apparent from a study of the following detailed description and the accompanying drawings of which:

Figures 1, 2, 3, 4, 5, 6, 7:
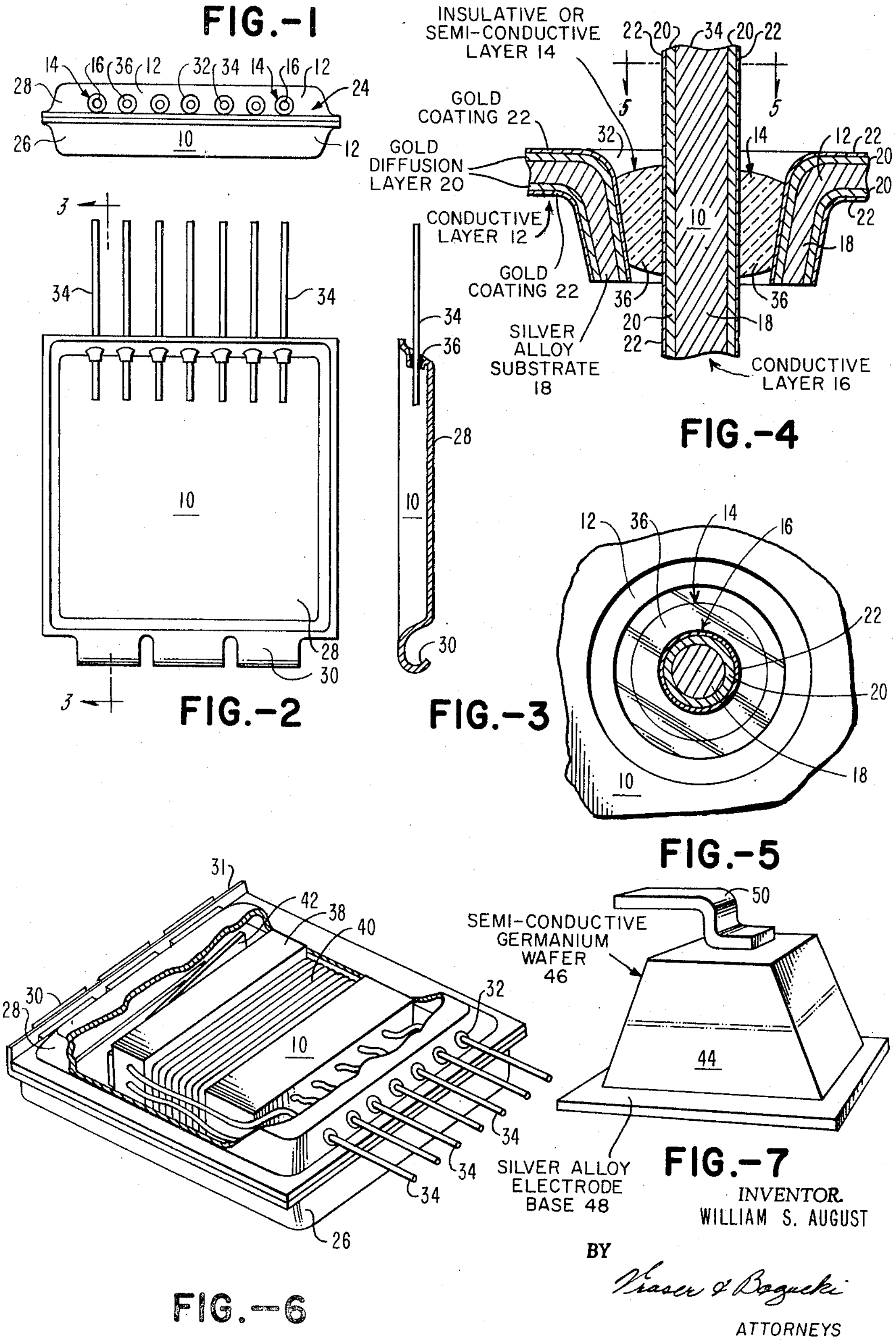
FIG. 1 is a schematic side elevation of a hermetically sealed electronic device.
FIG. 2 is a schematic plan view of the inside of the removable cover for the device of FIG. 1.
FIG. 3 is a sectional view taken along the section line 3—3 of FIG. 2.
FIG. 4 is an enlarged fragmentary schematic cross-section of a portion of the device of FIG. 1.
FIG. 5 is an enlarged schematic cross-section taken along the section line 5—5 of FIG. 4.
FIG. 6 is a schematic perspective view of the device of FIG. 1, with a portion broken away to illustrate the internal components thereof.
FIG. 7 is a schematic perspective view of an embodiment of a semi-conductive diode in accordance with the present invention.

Now referring more particularly to FIGS. 1 and 4 of the accompanying drawings, one embodiment of the improved electronic device of the present invention is illustrated. In FIG. 1, a device is shown in side elevation, which device 10 has improved high temperature stability. The device 10 generally comprises electrically conductive and electrically insulative components. In the particular device illustrated, there are provided a first electrically conductive layer or component 12, and a layer or component 14 of reduced electrical conductivity with respect to the first electrically conductive layer or component. Although the layer 14 is an insulator, it will be understood that other devices within the present invention can employ semi-conductors. A second layer of component 16 having electrical conductivity exceeding that of the layer 14 is permanently bonded thereto. The layer 16 is out of direct electrical contact with layer 12. In the embodiment illustrated in FIG. 1. the second electrically conductive layer 16 comprises, as does the first electrically conductive layer 12, a substrate 18 of an oxidation resistant, high temperature silver base alloy of the type previously described, which alloy has a coefficient of thermal expansion about that of the layer 14 of reduced electrical conductivity, which aids in providing the device with improved resistance to cracking under fluctuating temperature conditions. It will be understood that at least one of the layers 12 and 16 should be formed of the described alloy, and preferably both layer 12 and layer 16 are so formed.

The substrate 18 comprises a silver base alloy which contains about 0.1–2.0%, by weight, of magnesium oxide, an optional concentration of about 0.05–0.6%, by weight, of nickel oxide, and essentially the remainder silver, with or without a very low concentration of silver oxide and/or trace amounts of a stabilizer and diffusion depressant such as rhodium, cobalt or the like. The nickel oxide is not necessary, although desirable in most formulations. The substrate 18 is wholly enclosed in a thin protective gold diffusion layer 20 permanently bonded thereto and which is, in turn, wholly enclosed and permanently bonded to a thin outer corrosion-resistant coating of pure gold 22 as shown schematically in FIG. 4. Both the gold diffusion layer and the pure gold layer are optional, but desirable.

More specifically, the particular device 10 illustrated in FIGS. 1 to 6 of the accompanying drawings is a hermetically sealed electronic relay device. The layer 12 comprises a container 24 having a main body 26 and a removable cover 28 connected to the main body by a hinged portion 30 releasably coupled to a mating portion 31 along the margin at one end thereof and one edge of the main body 26. The cover 28 defines a plurality of apertures 32 through which extend a plurality of electrically conductive leads 34, one lead 34 for each aperture 32. The leads 34 comprise the second electrically conductive layer 16 and are held in place in the apertures 32 out of direct electrical contact with the cover 28 by the layer 14 of reduced conductivity, in the form of glass beads 36 fused to the leads 34 and to the portion of the cover 28 defining each aperture 32 so as to hermetically seal the apertures 32. It will be understood that, if desired, another electrically insulative material such as alumina, beryllia or the like ceramic could be used in place of the glass, with suitable bonding to the leads 34 and cover 28. However, glass is much preferred since it can be fused directly to the cover 28 and leads 34 at below the melting point of the silver alloy previously described, so that a brazing compound or the like is not required for the bonding operation.

Now referring more particularly to the silver alloy substrate 18, this substrate can be fabricated of the described alloy in any suitable manner. The alloy and certain characteristics thereof are set forth in U.S. Patent No. 3,117,894 to C. D. Coxe, issued January 14, 1964 for Hardening Spring By Internal Oxidation. Trace quantities of cobalt, rhodium and/or other diffusion depressants may be present in the alloy to stabilize the same and to depress undue diffusion of components thereof. The alloy has a low modulus of elasticity of between about 13,000,000 and 14,000,000, a high tensile strength of usually about 75,000 to about 80,000 p.s.i. and a coefficient of thermal expansion which may be, for example, of the order of about $10\times10^{-6}$ cm.$^2$/° C. or somewhat less. The low modulus of elasticity and high tensile strength aid in allowing the material to expand and contract with the semi-conductive or electrically insulative component to which it is connected, so that cracking therebetween is inhibited. The alloy has an electrical conductivity and a thermal conductivity of about 92%, a yield of strength of about 78,000 p.s.i., a melting point of approximately 1650° F. and dimensional stability within the range of about −650 F. to about 1400° F. It is non-magnetic. Moreover, the alloy is readily wettable with glass and the like insulators so that it readily permanently bonds thereto. Furthermore, the alloy can be irreversibly hardened as hereinafter more particularly described, so that it can be used in electrical components which require hardened spring-like qualities.

The alloy combines high thermal conductivity with high electrical conductivity and a coefficient of thermal expansion which approximates that of glass, various other ceramics, and such semi-conductors as silicon, which for example, has a coefficient of thermal expansion of about $4\times10^{-6}$ cm.$^2$/° C. Moreover, the coefficient of thermal expansion of the alloy can be varied over reasonable limits, depending upon the particular composition of the alloy, so as to obtain the desired close approximation to the coefficient of thermal expansion of the insulator or semi-conductor to be utilized in the device. This, in cooperation with the low modulus of elasticity and high tensile strength, results in improved, crack-free permanent bonding of the alloy to the glass, even when the device undergoes wide and rapid temperature fluctuations over a long period of time. The alloy has the following coefficient of thermal expansion listed in Table I for the particular compositions listed in that table:

TABLE I

| | Percent by Weight | Coefficient of Thermal Expansion |
|---|---|---|
| Composition A: | | |
| Silver | 99.5 | At 80° C., $145\times10^{-7}$ cm.$^2$/° C. |
| Magnesium oxide | 0.3 | |
| Nickel oxide | 0.2 | |
| Composition B: | | |
| Silver | 98.3 | At 100° C., $121\times10^{-7}$ cm.$^2$/° C. |
| Magnesium oxide | 1.7 | |
| Nickel oxide | 0 | |

Moreover, the alloy maintains its springiness at elevated temperatures up to about 1500° F. so that it can be formed, as previously described, into irreversably hardened stationary and movable relay contacts which operate efficiently over a wide temperature range.

The described silver base alloy can be oxidation hardened in any suitable manner, including that disclosed in the described U.S. Patent No. 3,117,894. As a specific example, one formulation of the alloy can be prepared by mixing and heating together to molten form silver in a concentration of about 99.5%, by weight, magnesium in a concentration of about 0.3%, by weight, and nickel in a concentration of about 0.2%, by weight, after which the resultant alloy can be oxidation hardened by heating it in air at about 1350° F. for about nine hours. This converts the magnesium to magnesium oxide and the nickel to nickel oxide, while maintaining the silver in substantially silver oxide-free form. Annealing can also be carried out over a temperature range of about 1000–1400° F. Hot and cold working can also be carried out on the material, depending on the use to which the material is to be put. The magnesium oxide apparently inhibits the movement of the silver crystals in the alloy and therefore increases the hardness of the products, while the nickel acts as a grain size inhibitor for the silver crystals. Vacuum melting of the alloy before oxidation hardening can also be used in order to decontaminate the alloy of impurities which might otherwise cause a slight depreciation in the physical characteristics thereof. Thus, the alloy is purified, if at all, before rolling it to finished shape or otherwise working it and oxidation hardening it.

It will be understood that the gold diffusion layer 20 and also the top pure gold layer 22 illustrated in FIG. 4 are optional but highly desirable in order to improve the corrosion resistance of the alloy, especially when the alloy is to be exposed to oxygen and/or sulfur bearing materials, such as sulfur-bearing gases, at elevated temperature. Accordingly, in various embodiments of the present invention, the alloy can be used without the gold diffusion layer and/or the top gold layer, but is preferably used with both such layers.

Thus, preferably, a gold diffusion layer 20 of appropriate thickness substantially completely encloses the substrate 18, as shown in FIG. 4. The gold diffusion layer can be formed in any suitable manner. Preferably, however, the layer is formed from gold containing essentially no contaminants except silver. Conventional gold plating processes generally are not satisfactory since they usually deposit a plating of gold which contains substantial quantities of copper and/or other contaminants, due to the nature of the components utilized in the plating process. It will be understood that the copper present in the gold plating can readily corrode or chemically react to form copper oxide and/or copper sulfate. Those areas represented by the copper oxide or copper sulfate in the gold plating are foci for further corrosion, so that much of the protective effect of the gold layer is lost. Gold in pure form is therefore necessary in order to provide maximum corrosion protection for the silver.

A pure gold coating can be applied to the substrate 18 by electroplating in the essential absence of contaminants, but otherwise utilizing conventional electroplating procedures. All components in contact with the electroplating solution during the plating operation should be overplated with silver or gold to prevent contamination of the gold plating being deposited. Vapor deposition also can be used, according to conventional procedures, except for the same type of precautions.

It is desirable, although not necessary, to initiate the plating procedure after the silver alloy substrate has been initially plated with a very thin plating of pure silver, as by electroplating or the like utilizing similar precautions against contamination of the silver plating. The silver plating step can be carried on in any suitable manner, as by an electrolytic procedure, vapor deposition or the like. The gold plating step can then be carried out. For example, a gold cyanide-sodium cyanide electrolyte has been used in an electroplating process wherein all exposed parts had been pretreated by plating thereon a thin layer of pure silver. The gold plating procedure can be continued until the gold plating is, for example, about 0.00003–0.00015 inch thick on a substrate about 0.07000 inch thick carrying a 0.00010–0.00015 inch thick silver plating. Obviously, any suitable thickness can be used for the substrate and for the silver and gold plating.

The gold diffusion step can then be carried out in any suitable manner at any suitable temperature below the annealing temperature of the substrate. For example, the gold diffusion step can be satisfactorily carried out in air in an oven at about 800° F. for a few minutes, for example about 5 minutes, until the gold is alloyed with the underlying silver plating disposed on the substrate, or with the substrate, when no silver plating is present. The gold diffusion step is continued until a color change from the typical gold color to a lighter color indicates that the gold has completely diffused into the underlying silver or silver alloy layer. The gold diffusion step has the effect of increasing the surface electrical conductivity of the work piece from that of gold to a value approaching that of silver, due to alloying of the gold with the silver.

A relatively thin, for example, $1–\frac{10}{1,000,000}$ inches thick, top gold plating 22 can then be permanently applied over the gold diffusion layer so as to substantially wholly enclose the same. The top gold plating can be applied by any suitable plating procedure which yields pure gold, i.e. which is contaminant free. Accordingly, for example, a procedure such as was described for the gold plating step in connection with the gold diffusion process can be used, making sure that all components are free of contaminants, including the metallic parts of the apparatus.

It will be understood that the gold diffusion layer readily bonds to the substrate in a permanent manner, and that the pure top layer of gold readily bonds in a permanent manner to the gold diffusion layer. It will be further understood that the top layer, or for that matter, the gold diffusion layer, or both, can be eliminated, but that the best results are obtained when both are present as protective means for the silver alloy substrate.

The canned relay device 10 may also include components such as those illustrated schematically in FIG. 6 of the accompanying drawings. Such components are secured in place in the container 24, as by brazing, soldering, or another conventional technique. In this regard, besides the container 24, the lead wires 34 and the glass beads 36 forming the hermetic seal between the wires and container, the device 10 may include means for opening and closing relay contacts within the container 24. As shown in FIG. 6 of the accompanying drawings, the device 10 may include an electromagnet 38 of conventional design, with suitable windings 40 and an armature 42 disposed adjacent one end thereof. Certain of the leads 34 can extend to an area adjacent the armature 42, as shown in FIG. 6, so that the armature acts as a movable relay contact. The adjacent leads 34 can act in a conventional manner as stationary relay contacts. Alternatively, the armature can be used to urge movable relay contacts (not shown) into and out of contact with stationary contacts (not shown). It will be understood that the described movable and stationary contacts can be formed of the described silver base alloy, depending on the particular internal construction of the device. The various components of the device are separately fabricated and then assembled, the lead wires 34 being bonded in place by fusing the glass beads thereto and to the cover 28. It will also be obvious that other conventional arrangements of electronic components disposed within hermetically sealed containers can be provided within the spirit and scope of the present invention.

Another embodiment of the present invention is schematically illustrated in FIG. 7 of the accompanying drawings. In this regard, a semi-conductor diode 44 comprises a semi-conductive germanium wafer 46 having a p-portion and an n-portion. To one side of the wafer 46 is secured, as by brazing, fusing or the like, for example, with a conventional brazing compound such as gold-silicon or gold-germanium, an electrode base 48 fabricated of the electrically conductive oxidation hardened silver base alloy previously described, with or without the protective gold diffusion and/or pure gold layers. To the opposite side of the electronic device is secured, as by brazing or the like, again utilizing a conventional bonding agent, such as gold-germanium, an electrically conductive layer in the form of a lead wire 50 fabricated of copper or the like. It will be understood that such device may be encapsulated or unencapsulated. The electrode base 48 about matches in coefficient of thermal expansion that of the germanium wafer ($10\times10^{-6}$ cm.$^2$/° C.) and, accordingly, is durable in use. Moreover, the device is highly efficient as a heat dissipator, since it maintains good thermal contact with the wafer 46 and has a thermal conductivity of about 92%. Accordingly, the semi-conductive device has improved characteristics.

It will be understood that the semi-conductive wafer 46 can be fabricated of silicon in place of germanium, in view of its similar coefficient of thermal expansion. Moreover, other semi-conductive materials can be used, such as gallium arsenide. In addition, the particular composition of the base electrode 48 can be varied to closely match that of the wafer 46, as previously described.

It will be further understood that the present invention also extends to other forms of electronic devices containing electrically conductive components maintained out of electrical contact with one another by electrically insulative and/or semi-conductive components. For example, the electronic device of the present invention may be provided in the form of a resistor which includes a vapor deposited or printed metallic circuitry, such as copper, silver or the like, disposed on one or more surfaces of a ceramic plate, for example fabricated of alumina, beryllia or the like. One or more circuitry-free surfaces of the plate can be secured, as by an organic bonding agent, such as an epoxy or polyurethane bonding agent, or by brazing, etc. to an electrically conductive component fabricated of the oxidation hardened silver base alloy described above, with or without the gold diffusion layer and/or the top gold coating. This electrically conductive component can be used as a lead to a heat sink fabricated of the same or another material and is capable of maintaining a permanent bond with the ceramic plate of alumina, beryllia or the like, while providing maximum conduction of heat away from the ceramic plate to the heat sink. For example, if the ceramic is alumina, the coefficient of thermal expansion thereof almost exactly matches that of the silver base alloy e.g. about $9.7\times10^{-6}$ cm.$^2$/° C. Accordingly, the durability of such a device is high. In the case where the ceramic is glass, the described silver base alloy can be directly wetted with and permanently bonded to the glass without employing a separate bonding agent.

It will be understood that other similar electronic devices can be provided within the scope of the invention. For example, single and multiple pin type contact devices, such as disconnectors, can be provided utilizing the described alloy for the pin material and also the retainer to which the pins are fixed by an electrically insulative material such as glass having a coefficient of thermal expansion about matching that of the silver base alloy.

Accordingly, an improved electrical electronic device is provided which incorporates as an electrically conductive component therein a component fabricated of a silver base alloy, in accordance with the foregoing, which alloy may or may not include a gold fusion layer and/or a top gold layer. The component so fabricated from such alloy has improved properties which render it wholly compatible with an electrically insulative or electrically semi-conductive component in the device to which it is permanently bonded. In this regard, the silver base alloy component has a low modulus of elasticity, a high tensile strength and a coefficient of thermal expansion preferably closely approximating the coefficient of thermal expansion of the electrically insulative or semi-conductive component. The described properties of the alloy are such that the two indicated components remain firmly together without cracking even when subjected to extremes of temperature. The improved device also exhibits high thermal conductivity, as well as high electrical conductivity and the described increased durability. Thus, the overall high temperature stability of the device is substantially increased. Further advantages of the invention are as set forth in the foregoing.

Various modifications, changes, alterations, substitutions and additions can be made in the present electronic devices. All such modifications, changes, alterations, substitutions and additions as are within the scope of the appended claims form a part of the present invention.

What is claimed is:

1. An electronic device having improved high temperature stability, said device comprising, in combination, at least one electrically conductive layer and a layer having electrical conductivity lower than that of said electrically conductive layers and fabricated of material selected from the group consisting of semi-conductive and electrically insulative material disposed on and bonded to said electrically conductive layers, at least one of said electrically conductive layers comprising a substrate of an oxidation hardened, high temperature silver base alloy containing about 0.1–2.0%, by weight, of magnesium oxide and essentially the remainder being silver, said substrate having a low modulus of elasticity, a high tensile strength and a coefficient of thermal expansion selected with respect to that of the layer of reduced electrical conductivity, whereby the device has improved resistance to cracking under widely fluctuating temperature conditions.

2. An electronic device having improved high temperature stability, said device comprising, in combination, at least one electrically conductive layer and a layer having electrical conductivity lower than that of said electrically conductive layers and fabricated of material selected from the group consisting of semi-conductive and electrically insulative material disposed on and bonded to said electrically conductive layers, at least one of said electrically conductive layers comprising a substrate of an oxidation hardened, high temperature silver base alloy containing about 0.1–2.0%, by weight, of magnesium oxide, and about 0.05–0.06%, by weight, of nickel oxide, with essentially the remainder thereof being silver containing not more than a minor concentration of silver oxide, and a thin gold diffusion layer permanently bonded to and substantially wholly enclosing said substrate, said substrate having a coefficient of thermal expansion, a modulus of elasticity and tensile strength such that the device has improved resistance to cracking of said layers when subjected to widely fluctuating temperature conditions.

3. The device of claim 2 wherein a thin layer of pure gold is provided around and permanently bonded to said gold diffusion layer.

4. An electronic device having improved high temperature stability, said device comprising, in combination, a first electrically conductive layer, a layer having electrical conductivity lower than that of said first layer and fabricated of semi-conductive material bonded to said first layer, and a second electrically conductive layer having electrical conductivity higher than that of the layer of reduced electrical conductivity and bonded thereto out of direct electrical contact with the first electrically conductive layer, at least one of said electrically conductive layers comprising a substrate of an oxidation hardened, high temperature silver base alloy containing about 0.1–2.0%, by weight, of magnesium oxide, up to about 0.6%, by weight, of nickel oxide, with essentially the remainder being silver, said substrate having a modulus of elasticity, tensile strength and coefficient of thermal expansion such that stresses between the substrate-containing electrically conductive layer and the layer of reduced electrical conductivity are reduced during operation of the device, whereby the device has improved resistance to cracking, even under widely fluctuating temperature conditions.

5. The device of claim 4 wherein both electrically conductive layers comprise said substrate enclosed with a thin gold diffusion layer to the outer surface of which is bonded a thin layer of pure gold.

6. The device of claim 4 wherein said layer of reduced electrical conductivity comprises germanium.

7. The device of claim 4 wherein said layer of reduced electrical conductivity comprises silicon.

8. The device of claim 4 wherein said layer of reduced electrical conductivity comprises glass.

9. The device of claim 4 wherein said layer of reduced electrical conductivity comprises alumina.

10. An electronic device having improved high temperature stability, said device comprising, in combination, a first electrically conductive retaining element defining at least one aperture, at least one electrically conductive lead disposed in each of said apertures, and electrically insulative material disposed in each of said apertures and extending between and bonded to both the leads and the electrically conductive material defining the aperture so as to retain the leads in a permanent position within the aperture and also electrically insulate the leads from the retainer defining the aperture, both the electrically conductive material comprising the retainer and the leads comprising oxidation hardened high temperature silver base alloy containing about 0.1–2.0%, by weight, of magnesium oxide, up to 0.6%, by weight, of nickel oxide, essentially the remainder being silver, said alloy having a modulus of elasticity, tensile strength, coefficient of thermal expansion such that the device has improved resistance to cracking under widely fluctuating temperature conditions.

11. An electronic device having improved temperature stability comprising a first electrically conductive retaining element defining a plurality of apertures, a plurality of lead wires of electrically conductive material, at least one of said wires being disposed in each of said apertures, and electrically insulative glass disposed in each of said apertures, and extending between and bonded to the leads in said aperture and the retaining element defining the aperture so as to retain the leads in a permanent position within the aperture and electrically insulate the leads from the retaining element defining the aperture, both the retaining element and the leads comprising an oxidation hardened, high temperature silver base alloy containing about 0.1–2.0%, by weight, of magnesium oxide, up to about 0.6%, by weight, of nickel oxide, with essentially the remainder comprising silver, said alloy having a low modulus of elasticity, high tensile strength and a coefficient of thermal expansion selected with respect to that of the glass such that the device has improved resistance to cracking under widely fluctuating temperature conditions, said alloy also being readily wettable by and readily fusible and permanently bondable to the glass.

12. The electronic device of claim 11 wherein said alloy is substantially enclosed within and permanently bonded to a thin gold diffusion layer and wherein the thin gold diffusion layer is essentially wholly enclosed within and permanently bonded to a thin layer of pure gold.

13. A hermetically sealed electronic device having improved high temperature stability, the device comprising an electrically conductive non-magnetic container defining a main cavity and at least one aperture communicating with said cavity, at least one electrically conductive lead disposed in said aperture and extending between the exterior of the container and said cavity, and an electrically insulative layer permanently bonded to the container in the area defining each aperture and to the leads disposed within the apertures, so as to electrically insulate the leads from the container and so as to hermetically seal the container apertures, the container and the leads each comprising an oxidation hardened high temperature silver base alloy containing about 0.1–2.0%, by weight, of magnesium oxide, up to about 0.6%, by weight, of nickel oxide, essentially the remainder comprising silver, the alloy having a low modulus of elasticity, high tensile strength and a coefficient of thermal expansion selected with respect to that of the electrically insulative layer such that the device has improved resistance to cracking under widely fluctuating temperature conditions.

14. A hermetically sealed electronic device having improved high temperature stability, the device comprising an electrically conductive non-magnetic container defining a hollow interior and a plurality of apertures communicating between the exterior and said interior of the container, a plurality of electrically conductive leads, at least one of which is disposed in each of said apertures and extends between the exterior and said interior of the container, and electrically insulative glass fused directly to and permanently bonded to the areas of the container defining each of the apertures and to the respective leads disposed within the apertures, so as to electrically insulate the leads from the container and hermetically seal the apertures, the container and the leads each comprising a substrate of an oxidation hardened high temperature silver base alloy containing about 0.1–2.0%, by weight, of magnesium oxide, about 0.05–0.6%, by weight, of nickel oxide, with essentially the remainder comprising silver, the leads and container each having a coefficient of thermal expansion about that of the glass, a low modulus of elasticity of the order of about $13.5–14\times10^6$ and a tensile strength in excess of about 70,000 p.s.i. whereby the device has improved resistance to cracking under fluctuating temperature conditions.

15. The device of claim 14 wherein a thin gold diffusion layer is integrally bonded to and substantially wholly encloses the substrate, and a thin layer of pure gold is integrally bonded to the gold diffusion layer and substantially wholly encloses the same.

16. An hermetically sealed electronic relay device having improved high temperature stability, the device comprising an electrically conductive non-magnetic hollow container defining a plurality of apertures communicating between the hollow interior and the exterior of the container, an electrically conductive lead disposed in each of said apertures and extending between the exterior and the hollow interior of the container, and electrically insulative glass fused directly to and permanently bonded to the container in the areas defining each of the apertures and to the respective leads disposed within the apertures, so as to electrically insulate the leads from the container and hermetically seal the container, the container and the leads each comprising a substrate of an oxidation hardened, high temperature silver base alloy containing about 0.1–2.0%, by weight, of magnesium oxide, about 0.05–0.6%, by weight, of nickel oxide, with essentially the remainder comprising silver, a thin gold diffusion layer integrally bonded to and substantially wholly enclosing the substrate and a thin layer of pure gold integrally bonded to and substantially wholly enclosing the gold diffusion layer, at least some of the leads comprising stationary relay contacts within the container, the device also including movable relay contacts, and means for moving the movable contacts into and out of contact with the stationary contacts, the substrate having a coefficient of thermal expansion of that about the glass, a modulus of elasticity of about $13.5–14\times10^6$ and a tensile strength in excess of about 70,000 p.s.i., whereby the device has improved resistance to cracking under widely fluctuating temperature conditions.

No references cited.

LEWIS H. MYERS, *Primary Examiner.*

H. C. COLLINS, *Assistant Examiner.*